United States Patent

Hayek et al.

Patent Number: 6,112,284
Date of Patent: *Aug. 29, 2000

[54] METHOD AND APPARATUS FOR LATCHING DATA FROM A MEMORY RESOURCE AT A DATAPATH UNIT

[75] Inventors: George R. Hayek, Cameron Park, Calif.; Joe M. Nardone, Portland; Aniruddha Kundu, Hillsboro, both of Oreg.; Kuljit S. Bains, Punjab, India

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/367,807

[22] Filed: Dec. 30, 1994

[51] Int. Cl.$^7$ .................................................. G06F 13/16
[52] U.S. Cl. .................... 711/167; 365/230.08; 365/203; 365/233; 395/878; 395/845
[58] Field of Search ............................ 365/230.08, 193, 365/203, 233; 395/432, 438, 494, 550, 405, 421.07, 421.08, 421.09, 878, 845; 711/167

[56] References Cited

U.S. PATENT DOCUMENTS

| | | | |
|---|---|---|---|
| 4,707,811 | 11/1987 | Takemae et al. | 365/239 |
| 4,792,929 | 12/1988 | Olson et al. | 365/233 |
| 4,953,130 | 8/1990 | Houston | 365/203 |
| 5,036,230 | 7/1991 | Bazes | 327/107 |
| 5,305,271 | 4/1994 | Watanabe | 365/205 |
| 5,349,566 | 9/1994 | Merritt et al. | 365/233.5 |
| 5,436,865 | 7/1995 | Kitazawa | 365/194 |
| 5,457,659 | 10/1995 | Schaefer | 365/222 |
| 5,488,581 | 1/1996 | Nagao et al. | 365/189.05 |
| 5,490,114 | 2/1996 | Butler et al. | 365/189.05 |
| 5,511,152 | 4/1996 | Lai et al. | 395/115 |
| 5,546,344 | 8/1996 | Fawcett | 365/189.05 |
| 5,555,209 | 9/1996 | Smith | 365/189.05 |
| 5,568,430 | 10/1996 | Ting | 365/189.05 |
| 5,598,376 | 1/1997 | Merritt et al. | 365/230.06 |

OTHER PUBLICATIONS (Micron, Maximizing EDO Advantages at the System Level, 1996, pp. 1–2).
International Search Report PCT/US95/16880, Apr. 23, 1996.
IBM Technical Disclosure Bulletin, vol. 28 No. 8, "Early Restore of Column Address For Dense Random–Access Memories In Page Mode", pp. 3540–3541, Jan. 1996.
Samsung Corp. Product Information, "Samsung Extended Data Out DRAM", pp. 67–74, May 1994.

Primary Examiner—Tod R. Swann
Assistant Examiner—J. Peikari
Attorney, Agent, or Firm—Blakely, Sokoloff, Taylor & Zafman

[57] ABSTRACT

A memory controller having a data strobe that tracks the column access strobe signal in a computer system having Extended Data Out (EDO) DRAMs. The data strobe signal follows, by a predetermined delay, the column access strobe signal, and therefore any skew in the column access strobe signal is inherently included within the data strobe signal. As a result, the data can be latched out, responsive to said data strobe signal, at approximately the center of the valid window.

14 Claims, 2 Drawing Sheets

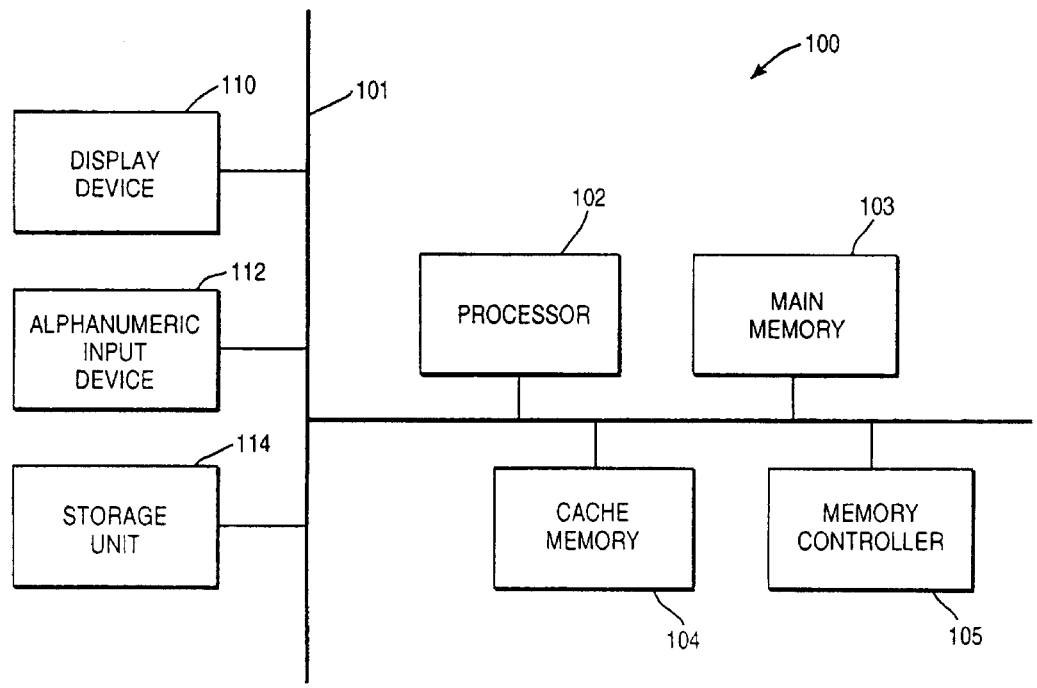
FIG_1
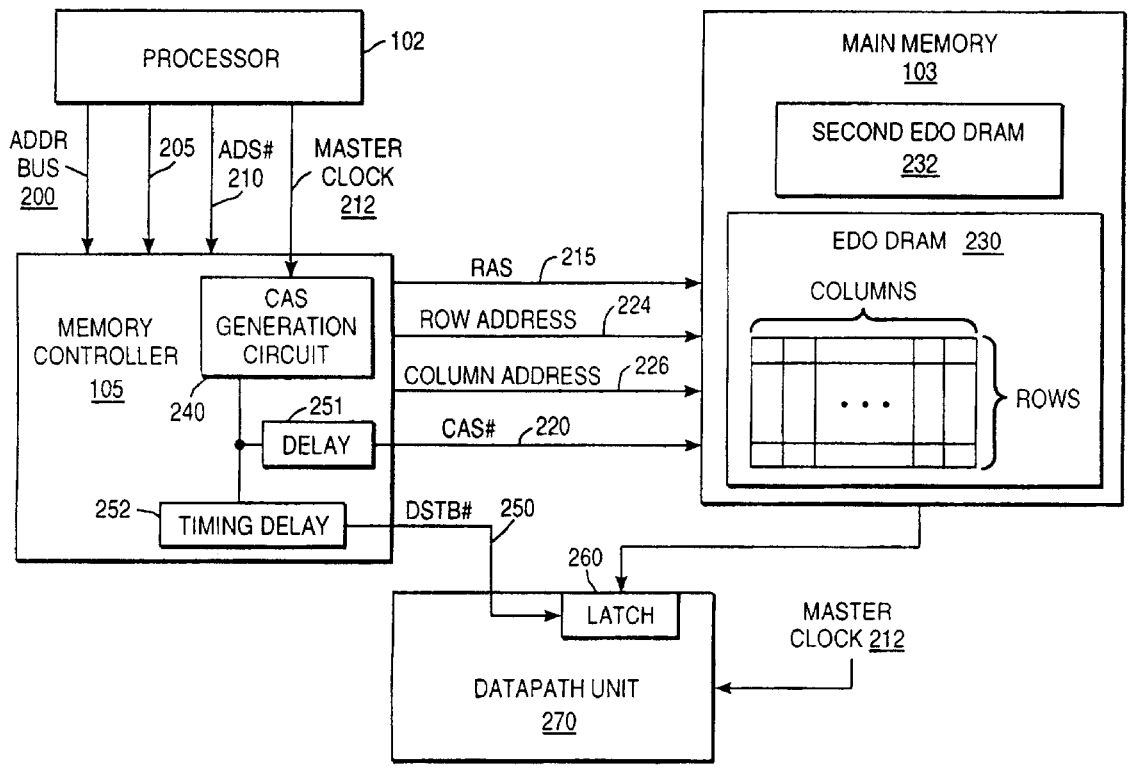
FIG_2

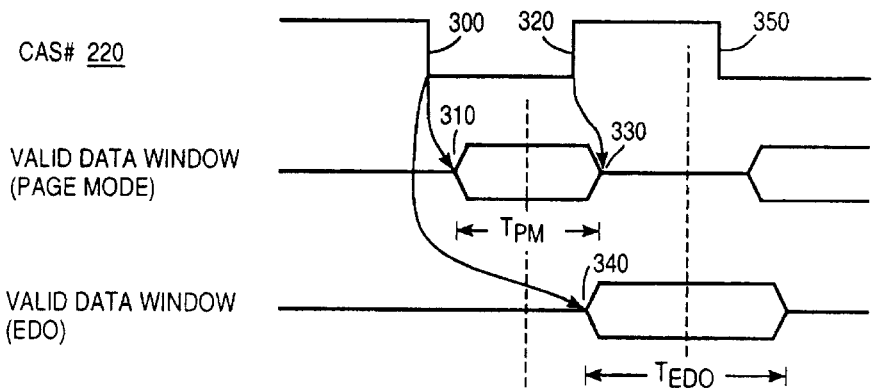
FIG_3
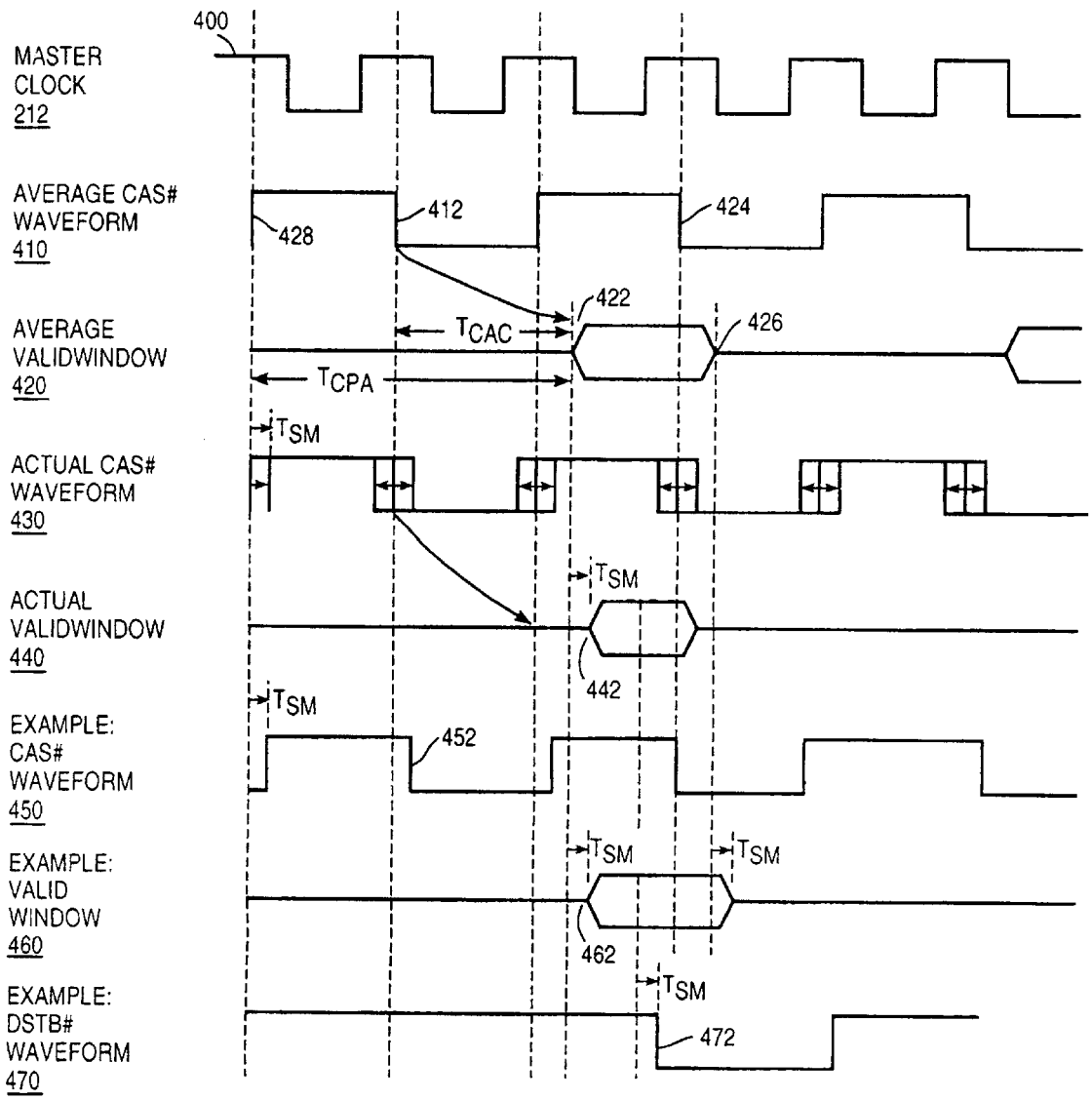
FIG_4

METHOD AND APPARATUS FOR LATCHING DATA FROM A MEMORY RESOURCE AT A DATAPATH UNIT

BACKGROUND OF THE INVENTION

1. Field of the Invention

The present invention relates to computer systems having memory and memory controllers to access the memory and supply data to a datapath.

2. Description of Related Art

In typical computer systems, a memory controller is coupled to the processor for controlling memory access to RAM. Particularly, the processor supplies an address, and the memory controller is responsible for accessing the RAM and controlling storage of the data in a data path. The performance of many microprocessor systems can be improved by increasing the rate at which data can be read from its random access memory (RAM).

Conventional low-cost RAM devices include dynamic RAM (DRAM), such as page mode DRAMs. In order to improve memory access time using the low-cost page mode DRAMs, bank-interleaved designs have been used.

In bank-interleaved designs, multiple banks of page mode DRAMs are coupled to the memory controller and the datapath. A two-bank bank-interleaved device achieves a burst rate twice that of a single bank alone. For example, if the burst rate is four clock cycles for the first bank and the second bank individually, then a two cycle clock rate can be achieved by alternating memory access between the two banks. Disadvantages of the bank-interleaved configuration include a higher pin count and additional logic to handle the interleaved operations.

High-cost synchronous DRAM based designs are also available. Synchronous DRAM devices can be very fast. However, these devices are expensive and it would be an advantage to provide a system that uses lower cost DRAMs while still providing a high burst rate.

A new type of DRAM device, termed a "Extended Data Out" (EDO) DRAM has recently been introduced. Theoretically, such devices can achieve better burst performance at lower cost than page mode DRAMs. However, achieving the maximum rate can be difficult due in part to the timing requirements of these EDO DRAMs in a system environment. EDO DRAMs extend the length of time over which the data becomes available. However, the data does not become available until much later in the cycle, and the availability continues until the next cycle. The delayed availability creates problems in strobing the accessed data and capturing valid data in the datapath device.

It would be an advantage to provide a memory system including EDO DRAMs that increases their performance and the burst rate systems using these EDO DRAMs.

SUMMARY OF THE INVENTION

The present invention provides a memory controller having a tracking strobe that enables a high burst rate for reading data from Extended Data Out (EDO) DRAMs. The invention provides a higher-bandwidth memory subsystem at a lower cost than otherwise possible with standard memory controllers. Particularly, the tracking strobe described herein can provide a two-clock, 66 MHz burst rate for reading data from 60 ns EDO DRAMs.

The memory controller supplies previously-stored data, responsive to a memory request from a processor, from Extended Data Out (EDO) DRAMS installed in a computer system. The data is latched from the DRAMs into a datapath by a data strobe (DSTB#) signal. The computer system has a master clock and an address circuit for supplying a row address and a column address. The memory controller comprises a column address strobe circuit that generates a CAS# signal responsive to the master clock and a memory request from the processor. The CAS# signal is supplied to access the EDO DRAM column to make DRAM data available. A timing delay circuit is coupled to the CAS circuit for generating the DSTB# signal responsive to the CAS# signal. A latching circuit in a datapath latches the data from the EDO DRAM into a latch, responsive to the DSTB# signal.

The method for accessing data in an EDO DRAM includes the steps of selecting the row responsive to a row address and a RAS# signal, and supplying a first cycle of the CAS# signal responsive to the master clock. The first cycle has a first transition for asserting column access to read the data, and a second transition to precharge the DRAM for the next cycle. Upon a first transition of CAS#, the column specified by the column address is accessed in DRAM. The DSTB# signal is supplied responsive to the first transition of the CAS# signal. The data is latched from the DRAM into datapath unit responsive to the DSTB# signal. In the preferred embodiment, the DSTB# signal is timed so that the data is clocked in at the beginning of the second cycle, specifically at a first transition for the second cycle.

BRIEF DESCRIPTION OF THE DRAWINGS

FIG. 1 is block diagram of a computer system including a memory controller and a main memory.

FIG. 2 is a block diagram of a memory system including the memory controller, an EDO DRAM, and a datapath unit, and illustrating the CAS# signal and the DSTB# signal.

FIG. 3 is a timing diagram that compares the timing of the valid data windows for page mode DRAMs and EDO DRAMs relative to the CAS# signal.

FIG. 4 is a timing diagram from several perspectives including an average (ideal) perspective, an actual perspective that includes variations due to varying skew, and an example that also shows an exemplary DSTB# signal.

DETAILED DESCRIPTION OF THE PREFERRED EMBODIMENT

FIGS. 1 through 4 of the drawings disclose various embodiments of the present invention for purposes of illustration. One skilled in the art will recognize alternative embodiments that may be employed without departing from the principles of the invention that are illustrated by the structures and methods described herein.

Overview of the Invention

In the system described herein, a memory controller produces a data strobe (DSTB#) signal that tracks a column access strobe (CAS#) signal rather than a master clock signal. The DSTB# signal, after a predetermined delay of the CAS# signal, latches data from the memory to a datapath device. Because the DSTB# signal tracks the CAS# signal, differences in propagation delays and flight time differences are limited or even eliminated entirely so that the data can be reliably latched within an effectively-increased data valid window within a short clock cycle. Also, the DSTB# signal can be used to latch data from the EDO DRAMs in a pipelined manner, i.e., the edge event that latches data can be used to begin the next access cycle.

In summary, because the DSTB# signal tracks the CAS# signal rather than the master clock, the DSTB# signal can be ideally timed in the center of the valid data window. Furthermore, any skew or delays in the CAS# signal also appear in the DSTB# signal, thereby effectively widening the data valid window. As a result, the system provides the performance of bank-interleaved implementations for a very small cost increment over current single bank implementations.

The Computer System

Reference is first made to FIG. 1 which is a block diagram illustrating a computer system of the present invention. As illustrated in FIG. 1, a computer system 100 of the present invention generally comprises a bus 101 for communicating information, a processor 102 coupled to the bus 101 for processing instructions, a main memory 103 coupled to the bus 101 for storing data and instructions for the processor 102, and a cache memory 104 coupled to the bus 101 for temporarily storing data and instructions for the processor 101. A memory controller 105 is coupled to the bus 101 for controlling access to the main memory 103 and the cache memory 104.

The computer system 100 includes a display device 110 coupled to the bus 101 for displaying information to the computer user, an alphanumeric input device 112 coupled to the bus 101 for communicating information and command selections to the processor 102, and a storage device 114 coupled to the bus 101 for storing data for the computer system 100.

The Memory Control System

Reference is now made to FIG. 2, which is a block diagram illustrating one embodiment of the present invention. As illustrated in FIG. 2, the processor 102 is coupled to the memory controller 105 via an address bus 200 and a data bus 205. An Address Strobe (ADS#) signal 210 is used by the processor 102 to initiate a read or write cycle to the memory subsystem. A master clock signal 212 is generated in the processor 102 and supplied to the memory controller 105.

The memory controller 105 is coupled to provide control and address signals to the main memory 103. The main memory 103 includes a plurality of memory devices such as an Extended Data Out DRAM (EDO) device 230 which is organized into columns and rows. Additional EDO DRAMs, such as a second EDO DRAM 232 can also be provided within the main memory 103.

From the memory controller 105, a Row Address Strobe (RAS#) signal 215 and the Column Address Strobe (CAS#) signal 220 are supplied to each memory device in main memory 103, including the EDO DRAM 230. The ADS# 210, the RAS# 215, and the CAS# 220 signals are labeled with a "#" to indicate that the signals are low when asserted (i.e., active low). The row address and the column address are supplied over buses 224 and 226.

In a normal mode of operation, the processor 102 applies the address to the address bus 200 and asserts the ADS# signal 210 to the memory controller 105. Responsive to the address and control signals from the processor 102, the memory controller 105 accesses the appropriate row and column in the DRAMs 230 and 232 via the CAS# 220 and RAS# 215 signals. The appropriate row is indicated on a row address bus 224, and the appropriate column is indicated on a column address bus 226. The appropriate row is accessed by strobing the RAS# 215 signal, and the appropriate column is accessed subsequently by using the CAS# 220 signal.

A CAS generation circuit 240 is included within the memory controller 105 in order to generate the CAS# signal from the master clock. The path that generates the CAS# signal includes conventional buffers, flip-flops and logic. The result is a delay period that delays the CAS# signal with respect to the master clock. This delay is may be termed "skew".

The amount of skew time varies for many reasons. For one, differences in manufacturing lots can cause the skew to vary. For example, a first manufacturing lot may have "fast silicon", and a second lot may be slower. Furthermore, the skew is affected by operating temperature variations. The voltage $V_{cc}$, which is the voltage supplied to the memory controller 105, also affects the skew. Furthermore, skew variations can be caused by loading variations. For example, if the CAS# signal 220 is divided between eight DRAM devices, then the loading for the eight devices will cause a greater delay than if only one DRAM device was to be connected to the CAS# signal.

The DSTB# signal 250 is generated from the CAS generation circuit 240, and therefore, much of the skew apparent in the CAS# signal is inherently included in the DSTB# signal. Any additional delay experienced by the CAS# signal 220 in addition to that inherently within the CAS generation circuit 240 is illustrated in a delay box 251. Such additional delay could be caused by, for example, average loading, flight time or other factors. A timing delay is included within the box 252, in order to ideally time the data strobe DSTB# signal 250 in the center of the valid data window. Particularly, the timing delay 252 is optimized together with the additional delay 251 in the CAS# signal 220 to give an appropriate timing of the DSTB# signal 250 relative to the CAS# signal 220, as will described in more detail.

The DSTB# signal 250 is applied to control a data latch 260 within a datapath unit 270. The latch 260 is coupled to receive data accessed in one of the EDO DRAMs in main memory and to latch it into the datapath unit 270 responsive to the DSTB# signal 250. The master clock signal 212 from the processor 102 is also connected to the datapath unit 270. Circuitry is included within the datapath unit 270 that operates after latching the data to synchronize the data in the latch 260 with the master clock 212.

Discussion of Relative Timing of the CAS# Signal 220 and the DSTB# Signal 250

Reference is now made to FIGS. 3 and 4 to illustrate the timing of the CAS# signal 220 relative to the DSTB# signal 250.

Reference is first made to FIG. 3, which is a diagram illustrating a comparison between the valid data window during which data is made available in page mode DRAMs versus the valid data window in EDO DRAMs. The CAS# signal 220, which is active low, is asserted by a first CAS# transition 300. As a result, in the page mode DRAM, data first becomes available at a time 310. Subsequently, an upgoing transition 320 of the CAS# signal 220 begins to precharge the columns of the EDO DRAM to prepare for the next cycle. After precharging begins, the valid data window closes at transition 330 and data is no longer available. The total time of the valid data window for page mode is $t_{pm}$. Typically, data is strobed for page mode DRAMs using the master clock.

For an EDO DRAM, the CAS# assertion 300 is the event that initiates access, but the data is not available until the transition 340, which may not occur until after the precharge initiation at 320. Thus, it can be seen that the valid data window for EDO DRAMs begins much later in the cycle than for page mode DRAMs. After the CAS# signal is asserted at 350 for the next cycle, the valid data window continues for a predetermined time. At that predetermined time, at the transition 360, the valid data window is closed.

The time during which valid data is available for an EDO is $T_{EDO}$ which is longer than valid data time $T_{PM}$ for the page mode. For reasons to be described, it is difficult to use the master clock to strobe the data out.

Reference is now made to FIG. 4 which is a timing diagram that illustrates and compares various waveforms of the CAS# signal 220, the valid data window, and the DSTB# signal 250. Average (ideal) signals are compared to the actual signals that take the skew into account. In an example, the CAS# signal 220, the valid window, and the DSTB signal 250 are shown, illustrating how the DSTB# signal and the valid window move together with the skew in the CAS# 220.

A master clock 212 provides a reference signal waveform 400 from the processor 102 in any conventional manner. The CAS# signals illustrated in FIG. 4 include the theoretical signal 410, the actual signal 430, and an exemplary signal 450. As discussed earlier, all CAS# signals are derived from the master clock 212.

An average CAS# waveform is illustrated at 410. After a time $T_{CAC}$ subsequent to the CAS# assertion 412, the valid window begins at a transition 422. At a time predetermined by the EDO DRAM device, a second assertion 424 of the CAS# waveform 410 occurs, and the valid window ends at a transition 426. Thus, the valid data window continues from the time 422 to the time 426. A sometimes useful specification $T_{CPA}$ is measured from precharge assertion of CAS# at the transition 428, continues until the beginning of the valid data window at time 422.

Reference is now made to the actual CAS# waveform 430 and the actual valid data window 440. A skew time $T_{SM}$ causes timing variations in the ideal waveform 410 under natural operating conditions, resulting in an actual waveform 430 in which timing variations are shown to vary by $T_{SM}$ in either direction from the average. As discussed earlier, timing variations can result from factors, such as manufacturing lot, temperature, $V_{cc}$, and loading variations. Any variation in the CAS# signal directly affects the timing of data availability. Therefore, the time $T_{SM}$ directly affects the actual waveform 440 for the valid data window. Due to these unavoidable variations, the time of certain data validity with respect to the master clock does not occur until a time 442. Furthermore, the window is shortened at its end due to these variations. The result is that the overall length of the valid data window is reduced. As the length of the cycles are shortened for higher speed, the valid data window is reduced further and timing variations become even more critical. Therefore, at high operational speeds, the valid data window is small and its timing relative to the master clock is such that the master clock cannot be reliably used to store data.

In the examples illustrated by the waveforms 450, 460 and 470, the CAS# signal 220 is shifted (delayed) by the time $T_{SM}$. As a result, the valid data window is shifted also by the time $T_{SM}$. In order to ensure that data is strobed within the middle of this valid data window, the DSTB# waveform 470 tracks the CAS# waveform 450, and therefore the DSTB# waveform 470 is also shifted by the amount $T_{SM}$. As a result, the data can be clocked in the middle of the valid window for increased accuracy. Advantageously, the cycle period can be reduced while still ensuring accurate data latching during the valid window.

In the implemented embodiment, the DSTB# signal 250 is derived from the CAS# signal provided by the CAS generation circuit 240. Accordingly, the timing variations between the CAS# signal and the DSTB# signal are minimized for factors such as manufacturing lots, temperature and $V_{cc}$. However, in one embodiment, the skew variations due to loading variations are not tracked by the DSTB# signal, due to cost considerations. In this embodiment, the CAS# signal from the CAS generation circuit 240 is divided into eight signals, each of which are supplied to a separate DRAM in main memory. The cost of combining each of these signals and using it to create a DSTB# signal for this implementation does not justify the additional accuracy that could otherwise be achieved. Therefore, the preferable, cost-efficient approach is to track the CAS# signal output from the CAS generation circuit 240.

From the above description, it will be apparent that the invention disclosed herein provides a novel and advantageous memory control system for DRAMs. As will be understood by those familiar with the art, the invention may be embodied in other specific forms without departing from its spirit or essential characteristics. The following claims are indicative of the scope of the invention, and all variations which come within the meaning and range of equivalency of the claims are to be embraced within their scope.

We claim:

1. A method of latching data output from an extended data out dynamic random access memory device (EDO DRAM) into a datapath unit, the method comprising:

asserting an address strobe signal to the EDO DRAM to cause the EDO DRAM to output data during a valid data interval;

delaying for a predetermined time period in response to assertion of the address strobe signal, the predetermined time period being substantially equal to an elapsed time between assertion of the address strobe signal and a center of the valid data interval; and asserting a data strobe signal to the datapath unit after delaying for the predetermined time to latch the data output by the EDO DRAM into the datapath unit.

2. The method of claim 1 wherein asserting an address strobe signal comprises asserting a column address strobe signal to strobe into the EDO DRAM an address identifying a storage column in the EDO DRAM.

3. The method of claim 1 further comprising deasserting the address strobe signal before asserting the data strobe signal.

4. A memory controller comprising:

a strobe circuit configured to assert an address strobe signal to an extended data out dynamic random access memory device (EDO DRAM) to cause the EDO DRAM to output data during a valid data interval; and a delay circuit coupled to the strobe circuit, said delay circuit being configured to assert, responsive to assertion of the address strobe signal, a data strobe signal to latch the output data into the datapath unit after delaying for a time period that is substantially equal to an elapsed time between assertion of the address strobe signal and a center of the valid data interval.

5. The memory controller of claim 4 wherein the address strobe signal is a column address strobe signal.

6. The memory controller of claim 4 wherein said strobe circuit is further configured to deassert the address strobe signal before the data strobe signal is asserted to the datapath unit by said delay circuit.

7. A computer system comprising:

a clock for generating a master clock signal;

an extended data out dynamic random access memory device (EDO DRAM) having an address input and an address strobe input, said EDO DRAM being configured to output a data value indicated by an address present at the address input when an address strobe signal is detected at the address strobe input;

a datapath unit having a data input coupled to receive the data value output by said EDO DRAM and a data strobe input, said datapath unit being configured to latch the data value upon detecting a data strobe signal at the data strobe input; and a memory controller including a strobe circuit to assert an address strobe signal to said EDO DRAM in response to a transition of the master clock signal to cause said EDO DRAM to output the data value during a valid data interval; and a delay circuit to assert, responsive to the assertion of the address strobe signal, the data strobe signal to said datapath unit after delaying for a time period that is substantially equal to an elapsed time between assertion of the address strobe signal and a center of the valid data interval.

8. The computer system of claim 7 wherein the address is a column address and wherein the address strobe signal is a column address strobe signal.

9. The computer system of claim 7 wherein said datapath unit includes a resynchronizing circuit configured to resynchronize the latched data with the master clock signal.

10. The computer system of claim 8 further including a processor and wherein said clock is included in said processor.

11. The computer system of claim 9 wherein said strobe circuit is further configured to deassert the address strobe signal before the data strobe signal is asserted to said datapath unit by said delay circuit.

12. A memory controller comprising:

means for asserting an address strobe signal to an extended data out dynamic random access memory device (EDO DRAM) to cause the EDO DRAM to output data during a valid data interval; and means for asserting a data strobe signal, responsive to assertion of the address strobe signal, to latch the data into the datapath unit after delaying for a time period that is substantially equal to an elapsed time between assertion of the address strobe signal and a center of the valid data interval.

13. The memory controller of claim 12 wherein the address strobe signal is a column address strobe signal.

14. The memory controller of claim 12 wherein said means for asserting the address strobe signal includes means for deasserting the address strobe signal before the data strobe signal is asserted to the datapath unit by said means for asserting the data strobe signal.

* * * * *